United States Patent
Randazzo et al.

(10) Patent No.: US 6,924,689 B2
(45) Date of Patent: Aug. 2, 2005

(54) LEVEL SHIFTER REFERENCE GENERATOR

(75) Inventors: Todd A. Randazzo, Colorado Springs, CO (US); E. Wayne Porter, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 323 days.

(21) Appl. No.: 10/166,309

(22) Filed: Jun. 10, 2002

(65) Prior Publication Data

US 2003/0227313 A1 Dec. 11, 2003

(51) Int. Cl.[7] ................................................. H03L 5/00
(52) U.S. Cl. ......................... 327/333; 327/427; 326/63; 326/80
(58) Field of Search .......................... 323/20, 266, 313, 323/314, 60; 327/538, 539, 333, 52, 51, 427, 319; 307/242, 364, 296.4, 279; 326/80, 81, 83, 86, 70, 71, 63

(56) References Cited

U.S. PATENT DOCUMENTS

| | | | | |
|---|---|---|---|---|
| 5,397,979 A | * | 3/1995 | Yamamoto | 323/281 |
| 6,556,061 B1 | * | 4/2003 | Chen et al. | 327/333 |
| 6,630,859 B1 | * | 10/2003 | Wang | 327/539 |

* cited by examiner

*Primary Examiner*—Rajnikant B. Patel
(74) *Attorney, Agent, or Firm*—Luedeka, Neely & Graham, P.C.

(57) ABSTRACT

A core voltage to input output voltage level shifter of the type that uses a reference voltage source to generate a reference voltage to limit a drain voltage on at least one voltage sensitive node connected to a voltage sensitive switching device, that resides on a high voltage domain. A feed back line runs from the voltage sensitive node to the reference voltage source. A feed back structure varies the reference voltage in response to the drain voltage on the at least one voltage sensitive node, and thereby maintains the drain voltage at a substantially constant desired value.

20 Claims, 9 Drawing Sheets

LEVEL SHIFTER REFERENCE GENERATOR

FIELD

This invention relates to the field of integrated circuit design. More particularly, this invention relates to voltage level shifting between relatively voltage sensitive core transistors and relatively voltage tolerant input output transistors.

BACKGROUND

Traditionally, all of the various components of an integrated circuit were powered at a single voltage level. However, in more recent technologies, different components of an integrated circuit are powered from different voltage sources. For example, in some new technologies the core of an integrated circuit, such as the memory or logic components, is powered off of one voltage source, and the input output components of the integrated circuit are powered off of a different voltage source. Typically, the core voltage level, generally designated as VDDcore, is nominally 1.2 volts or less and the input output voltage level, generally designated VDDio, is nominally 3.3 volts. An integrated circuit that is powered by more than one voltage source typically uses a level translator, also called a voltage level shifter, to step digital signals between the core voltage level and the input output voltage level.

However, as integrated circuit designs have evolved, the demands on level shifters have also evolved. For example, as the core voltage has dropped in potential, it has approached the lower-most levels at which the relatively voltage tolerant input output transistors function, also known as the threshold voltage of the input output transistors. In other words, the signals received from a voltage sensitive core transistor by a voltage tolerant input output transistor may be at so low a level, that the voltage tolerant input output transistor may not operate properly or reliably in response to the lower voltage signal. Thus, there is a need for an alternate signal to trigger the operation of the relatively voltage tolerant input output transistors in level shifters.

Conversely, as the core voltage has dropped in potential, the relatively voltage sensitive core transistors have become increasingly sensitive to the relatively higher input output voltage potentials. In other words, the signals received from a voltage tolerant input output transistor by a voltage sensitive core transistor are at so high a level, that the voltage sensitive core transistor may be damaged in response to the higher voltage signal. Thus, there is a need for a reliable signal threshold to limit the signal to the relatively voltage sensitive core transistors in level shifters.

There is a need, therefore, for new designs of level shifters.

SUMMARY

The above and other needs are met by an improvement in a core voltage to input output voltage level shifter of the type that uses a reference voltage source to generate a reference voltage to limit a drain voltage on at least one voltage sensitive node connected to a voltage sensitive switching device, that resides on a high voltage domain. A feed back line runs from the voltage sensitive node to the reference voltage source. A feed back structure varies the reference voltage in response to the drain voltage on the at least one voltage sensitive node, and thereby maintains the drain voltage at a substantially constant desired value. It is appreciated that when it is stated herein that the drain voltage at the voltage sensitive node is maintained at a substantially constant desired value, this does not mean that the voltage sensitive node is held at this potential during a logical low state, but rather the voltage sensitive node is held at the constant desired value during the logical high state. Any problem that there may be with the voltage sensitive node drawing down to a logical low state is not specifically considered herein.

Thus, in a most preferred embodiment as described herein, the reference voltage source uses feed back from the voltage sensitive node to control the voltage potential on the voltage sensitive node. In this manner, the preferred designs tend to be less sensitive to models and model predictability, temperature, and VDDio drift. Further, the preferred designs generate a stable protection voltage on the voltage sensitive node, rather than just a specific reference voltage value. These designs are also very tolerant of temperature, process, and voltage variations on the voltage sensitive regulating devices.

In various preferred embodiments the feed back structure is an op amp with a first input tied to the feed back line, and a second input tied to one of a variety of different inputs. For example, the second input can be tied to a low voltage domain, such as VDDcore, or an X gain stage that produces an output that is a desired multiple of an input to the X gain stage. In one embodiment the input to the X gain stage is the low voltage domain, such as VDDcore. In an alternate embodiment the input to the X gain stage is a band gap reference voltage with an input on the high voltage domain, such as VDDio. The X gain stage is most preferably a circuit that produces an output that is a multiple of its input and a ratio of two passive elements, such as resistors.

According to another aspect of the invention there is also presented a method for limiting a drain voltage on at least one voltage sensitive node connected to a voltage sensitive switching device residing on a high voltage domain in a core voltage to input output voltage level shifter.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
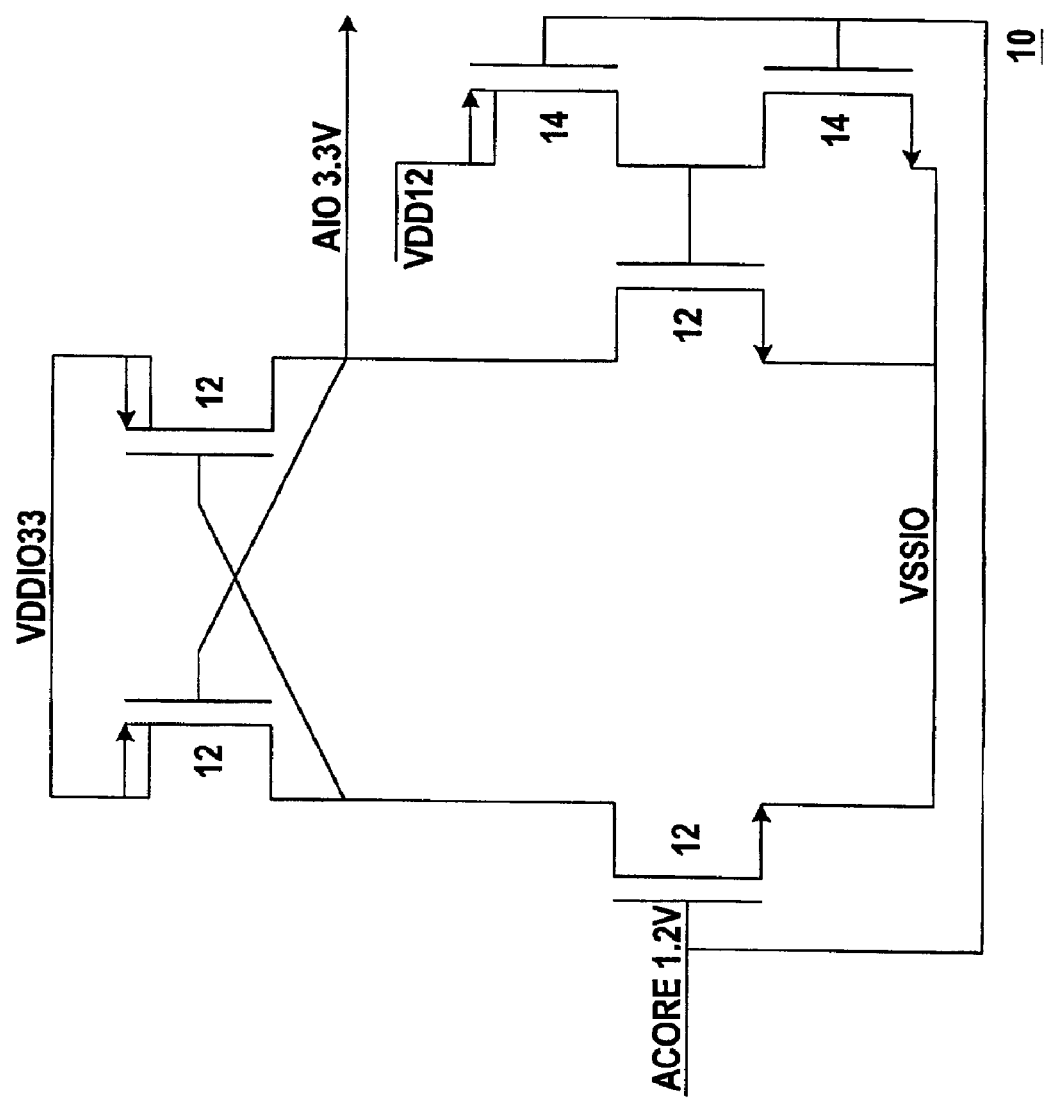
FIG. 1 is a circuit diagram of a level shifter.
Figure 2:
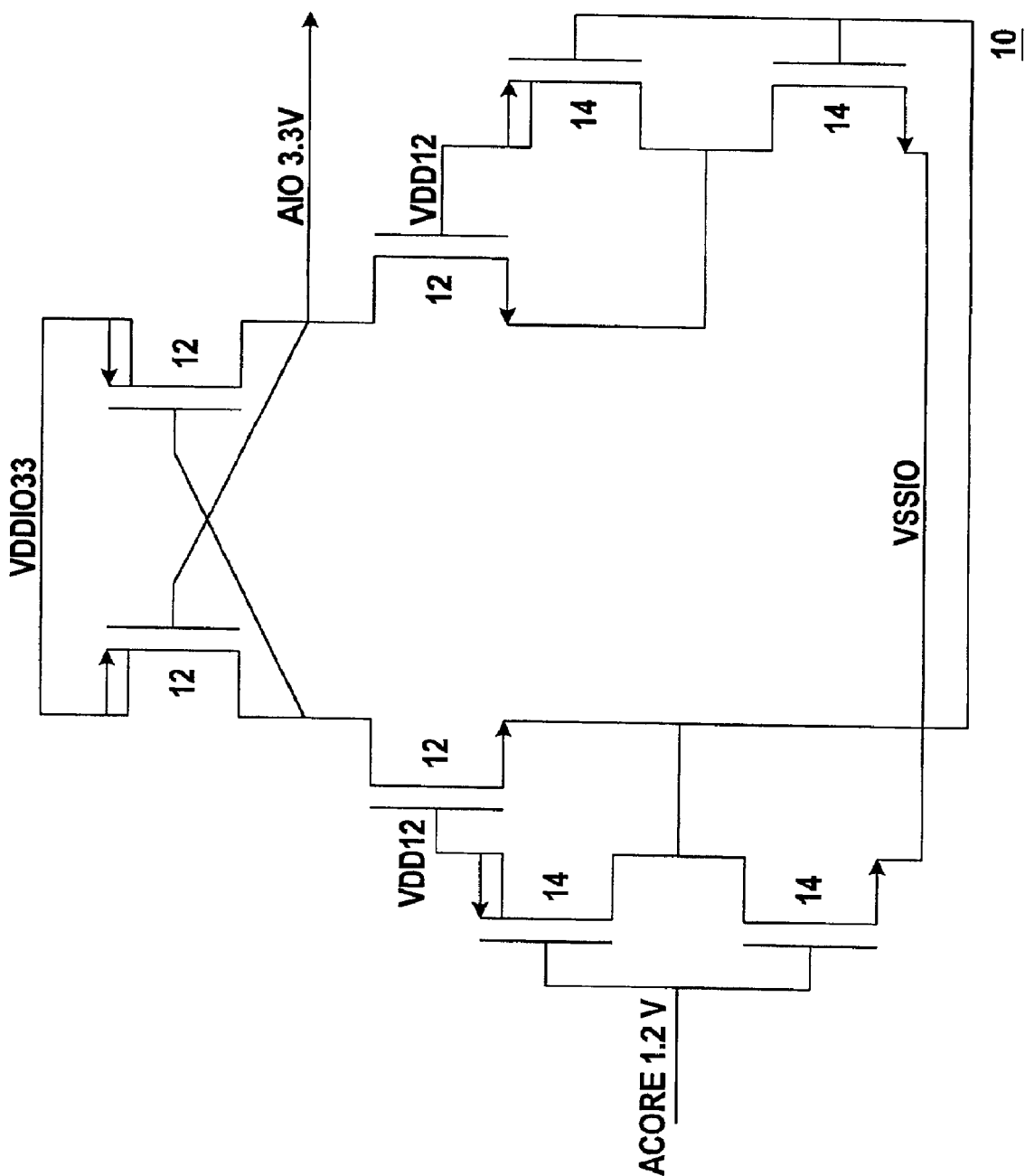
FIG. 2 is a circuit diagram of an alternate embodiment of a level shifter.

FIGS. 1 and 2 depict two level shifter designs 10. FIG. 1 depicts a signal to gate MOS level shifter 10, and FIG. 2 depicts a signal to source MOS level shifter 10. Although not all of the various embodiments presented herein are depicted in combination with both of these two designs, it is appreciated that the various embodiments are equally applicable to both of these designs, and that such additional embodiments are within the scope of the present invention.

Figure 10:
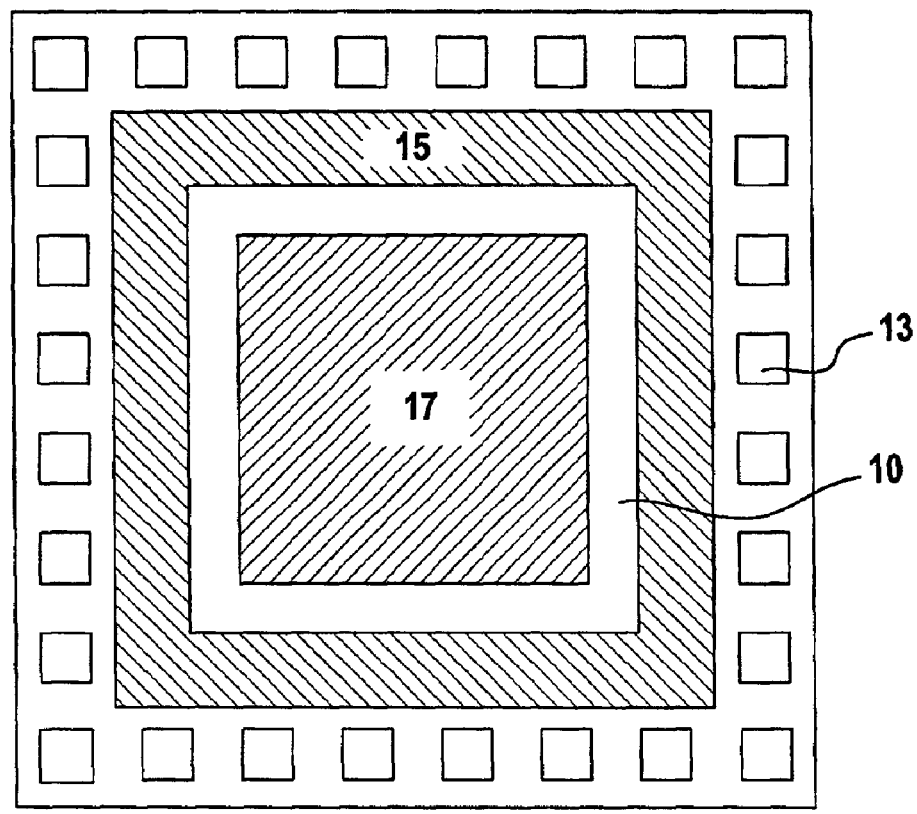
FIG. 10 is a functional block diagram of an integrated circuit with the level shifters according to a preferred embodiment of the present invention.

With reference now to FIG. 10, the level shifters 10 shift the voltage of digital signals between the voltage potential used for core devices 17, such as transistors, and the voltage potential used for input output devices 15, such as transistors, which make electrical connections to the bonding pads 13 of the integrated circuit 11. As described elsewhere herein, the core devices 17 preferably operate at a relatively lower voltage, nominally about 1.2 volts or lower, and thus are relatively more voltage sensitive than the input output devices 15. Similarly, the input output devices 15 preferably operate at a relatively higher voltage, nominally about 3.3 volts, and thus are relatively less voltage sensitive than the core devices 17. The voltage potential of the core devices 17 tends to be insufficient to reliably drive the input output devices 15, and the voltage potential of the input output devices 15 tends to be great enough to damage the core devices 17. In FIG. 10, individual core devices 17 and individual input output devices 15 are not depicted, rather just the general regions of such devices are depicted, so as to not unnecessarily encumber the figure with inessential details.

With reference again to FIGS. 1 and 2, the level shifter 10 is fabricated with both relatively voltage sensitive core transistors 14, and relatively voltage tolerant input output transistors 12. It is appreciated that although the relatively sensitive transistors 14 are generally designated as core transistors herein, they do not necessarily perform the same functions as the core transistors of the integrated circuit. Rather, the designation of core transistor as applied to the relatively sensitive transistors 14 implies that they are of a similar design as the core transistors, with regard to at least their voltage sensitivity and the voltage domain in which they are primarily designed to function. Similarly, although the relatively tolerant transistors 12 are generally designed as input output transistors herein, they also do not necessarily perform the same functions as the input output transistors of the integrated circuit. Rather, the designation of input output transistor as applied to the relatively tolerant transistors 12 implies that they are of a similar design as the input output transistors, with regard to at least their voltage sensitivity and the voltage domain in which they are primarily designed to function.

With reference to the voltage shifters 10 of FIGS. 1 and 2, VDDcore, or VDD12, with a voltage of no more than about 1.2 volts is applied to the gate of at least one of the voltage tolerant transistors 12, because the drain of that device may go to VDDio. However, as described above, reducing the high gate potential on a voltage tolerant device 12 to such a low value, such as 1.2 volts, 1.0 volt, 0.8 volts or even lower with current technology, tends to cause the voltage tolerant device 12 to function very slowly and also requires it to be quite big in terms of surface area. Often, such a device does not function reliably, because the VDDcore is so close to the threshold voltage of the voltage tolerant device 12 that the voltage tolerant device 12 does not switch reliably.

Figure 3:
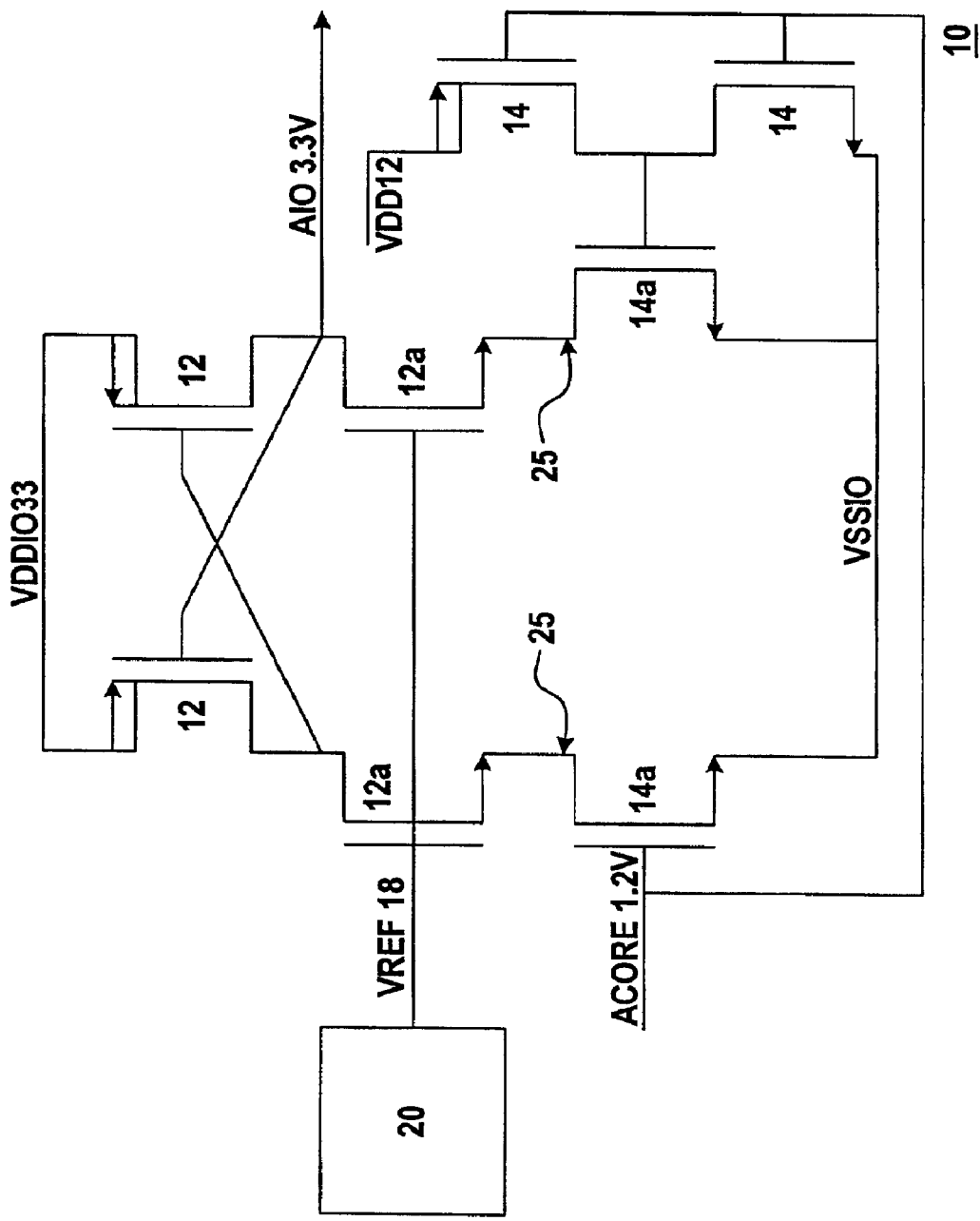
FIG. 3 is a circuit diagram of a level shifter with a reference voltage.
Figure 4:
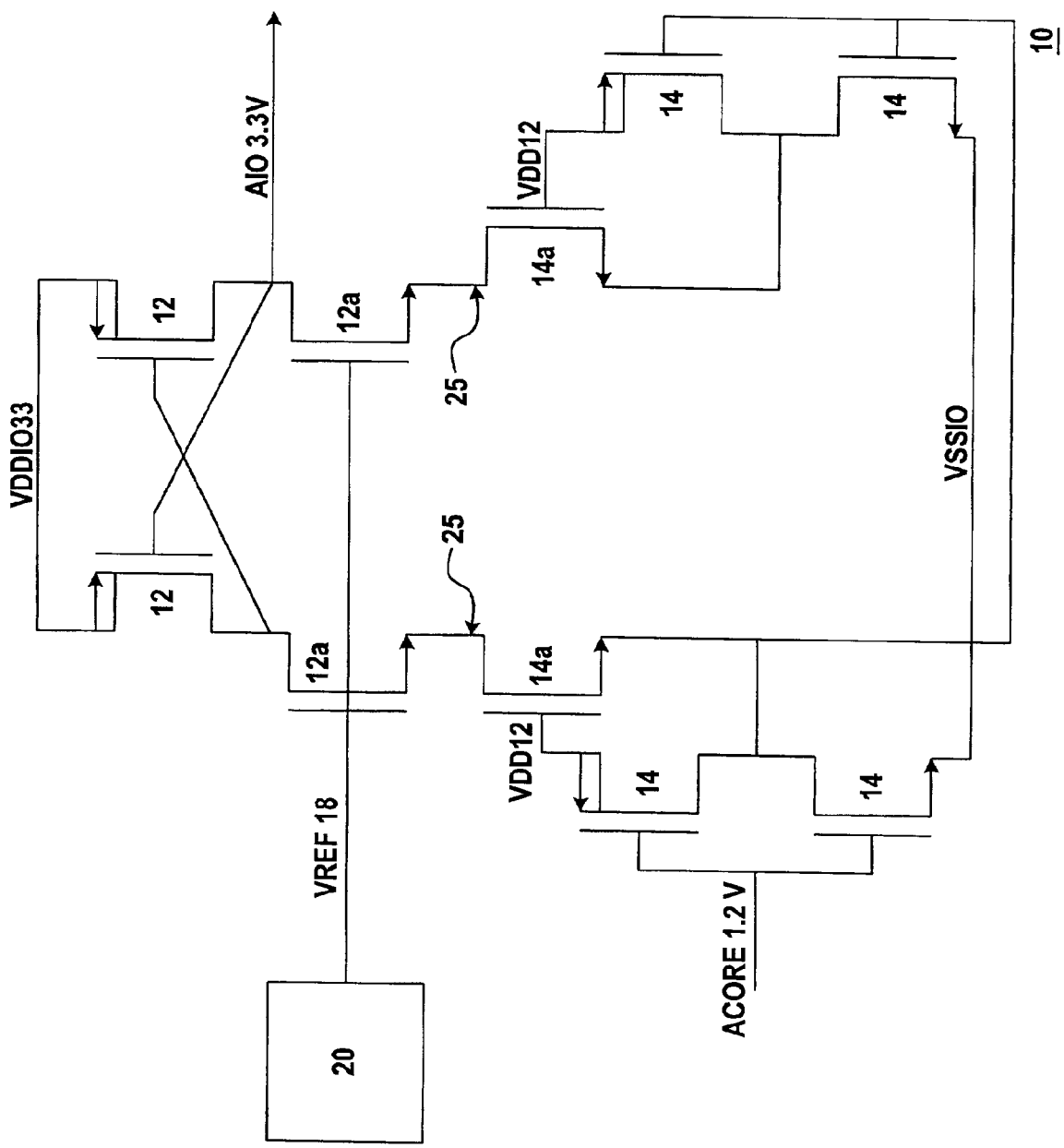
FIG. 4 is a circuit diagram of an alternate embodiment of a level shifter with a reference voltage.

With reference now to FIG. 3, there is depicted a modified embodiment of the voltage shifter 10 of FIG. 1, in which a reference voltage from a reference voltage source 20 is applied on line 18 at the gates of two additional transistors 12a within the voltage shifter 10. FIG. 4 depicts the voltage shifter 10 of FIG. 2 that has been modified with a reference voltage source 20 that provides a reference voltage on line 18 at the gates of two additional transistors 12 with the voltage shifter 10. The subsequent figures depict only the various embodiments in reference to the voltage shifter 10 of FIG. 1. However, as mentioned above, it is appreciated that all such alternate embodiments are applicable to the design of FIG. 2, even though not explicitly depicted herein.

With the reference voltage applied to their gates, the voltage tolerant devices 12a act as voltage regulators within the voltage shifter 10. The reference voltage is preferably selected to insure that the drain of the switching device 14a does not exceed VDDcore. In this manner, the voltage sensitive devices 14a, as depicted in FIGS. 3 and 4, are protected from a voltage potential that would tend to damage them. Thus, the switching transistors 14a in the embodiments of FIGS. 3 and 4 can be fabricated from faster voltage sensitive devices, rather than from slower voltage tolerant devices 12, as depicted in FIGS. 1 and 2.

Figure 5:
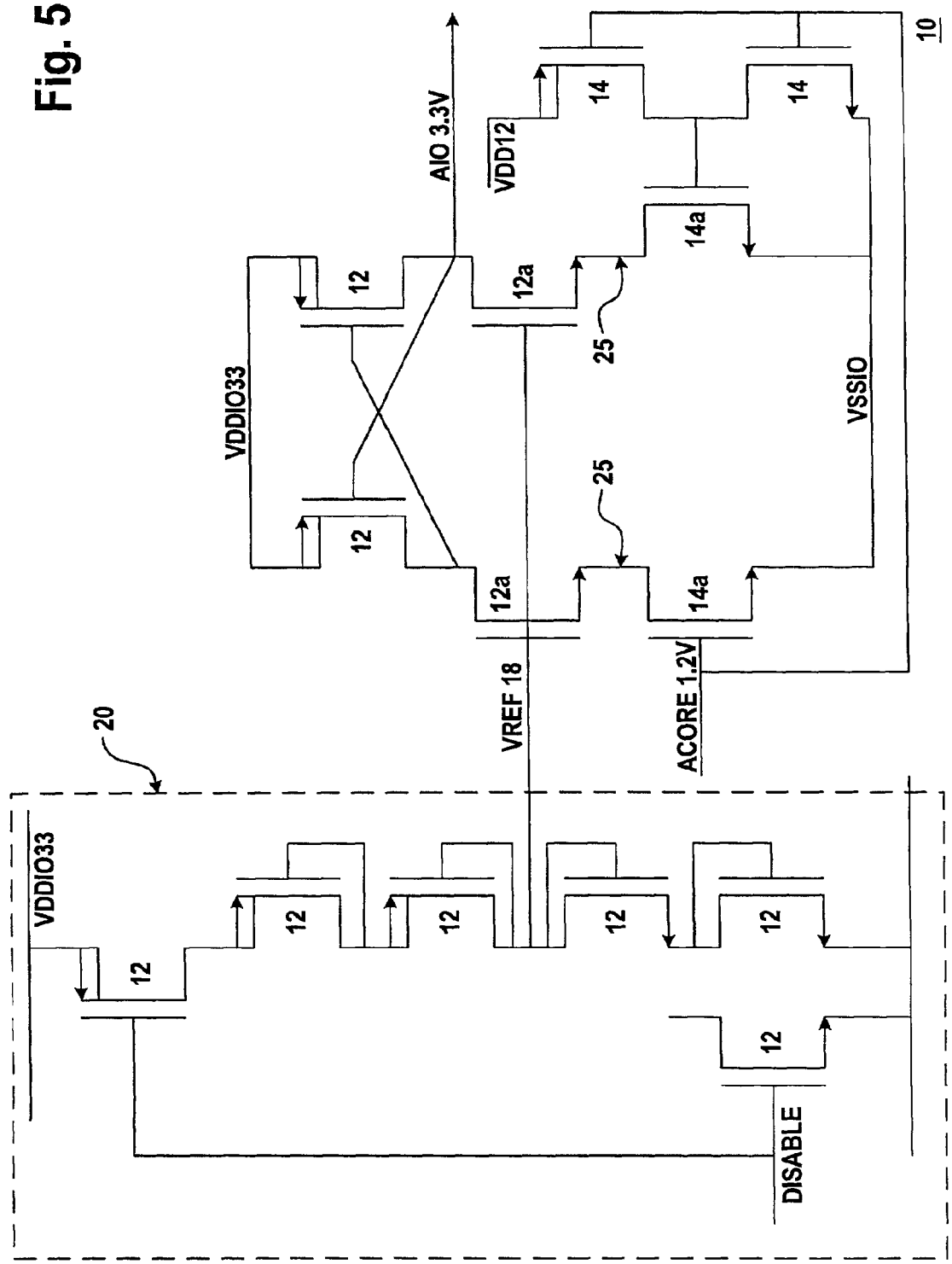
FIG. 5 is a circuit diagram of a level shifter with a reference voltage from a voltage divider.

With reference now to FIG. 5, there is depicted a specific embodiment of reference voltage source 20, where the reference voltage is derived from VDDio with a voltage divider. Unfortunately, the voltage divider of the reference voltage source 20 of this embodiment may not provide a constant reference voltage under certain circumstances, and thus may not adequately limit the voltage that is seen by the voltage sensitive switching devices 14a. For example, such a voltage divider tends to be sensitive to temperature drift, has direct sensitivity to variations and noise in VDDio, is sensitive to VDD ramp during power up, and draws direct current power between VDDio and VSS. To minimize the direct current power, the reference voltage becomes a high impedance node and may move considerably in value while the level shifter 10 switches. Further, even with a steady reference voltage in this configuration, the reliability critical voltages on the input nodes 25 will tend to vary over process and temperature as the threshold voltage and gamma of the voltage tolerant regulator devices 12a vary.

Figure 6:
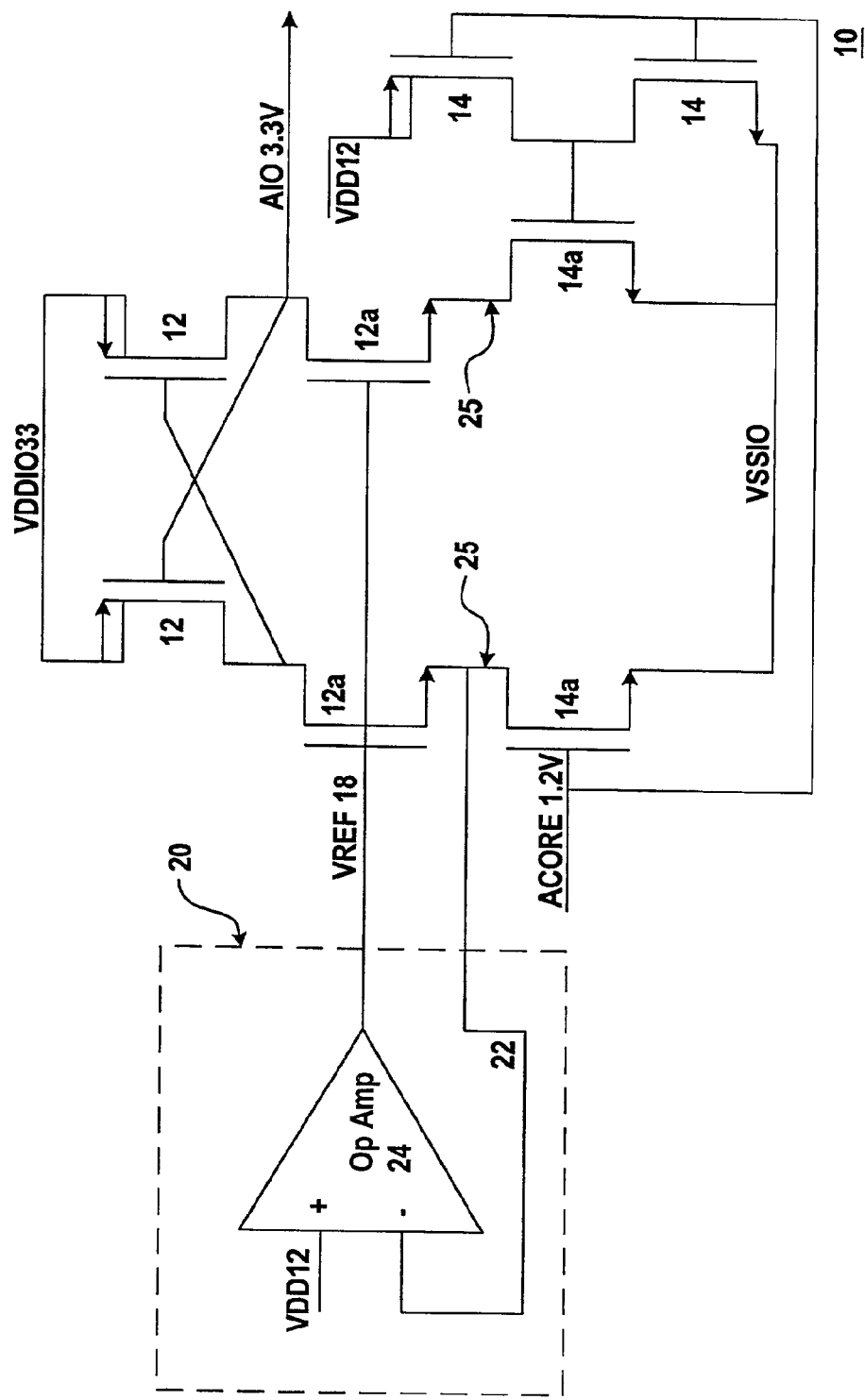
FIG. 6 is a circuit diagram of a level shifter replica bias circuit for generating a reliable level shifter cascade reference voltage.

With reference now to FIG. 6 there is depicted a further embodiment of the voltage shifter 10, where an op amp 24 is employed as the reference voltage source 20. One of the inputs as depicted is tied to VDDcore, but may also be tied to VSS. The other input of the op amp 24 is tied to at least one of the voltage sensitive input nodes 25 via line 22. In this manner, the voltage potential on the nodes 25, and thus the voltage potential on the inputs of the voltage sensitive switching devices 14a, is preferably never greater than about VDDcore. Whenever a drift in the voltage potential on the nodes 25 begins to occur, the drift is corrected by the controlling output of the op amp 24 on line 18. Thus, the reference voltage source 20 of this preferred embodiment incorporates a feed back on line 22. The op amp 24 is preferably of a type that remains substantially linear from about to VSS to about VDDcore, and is most preferably a PMOS input stage. However, a high gain op amp is not required. Rather, a very simple, slow, low power op amp may be used.

In some cases, the drain voltage reliability of the MOSFETS of the voltage shifter 10 is different than their gate voltage reliability. For example, in some cases hot electron degradation may dictate that the voltage on the sensitive nodes 25 be preferably limited to a lower potential than VDDcore, such as (0.9)(VDDcore). Alternately, in some cases the devices are more drain voltage tolerant than gate voltage tolerant, such as due to voltage division between the drain depletion layer and the gate oxide. In the designs as presented, the overriding design goal is most preferably to limit Vdrain on the voltage sensitive switching devices 14a, and not necessarily Vgate.

Figure 7:
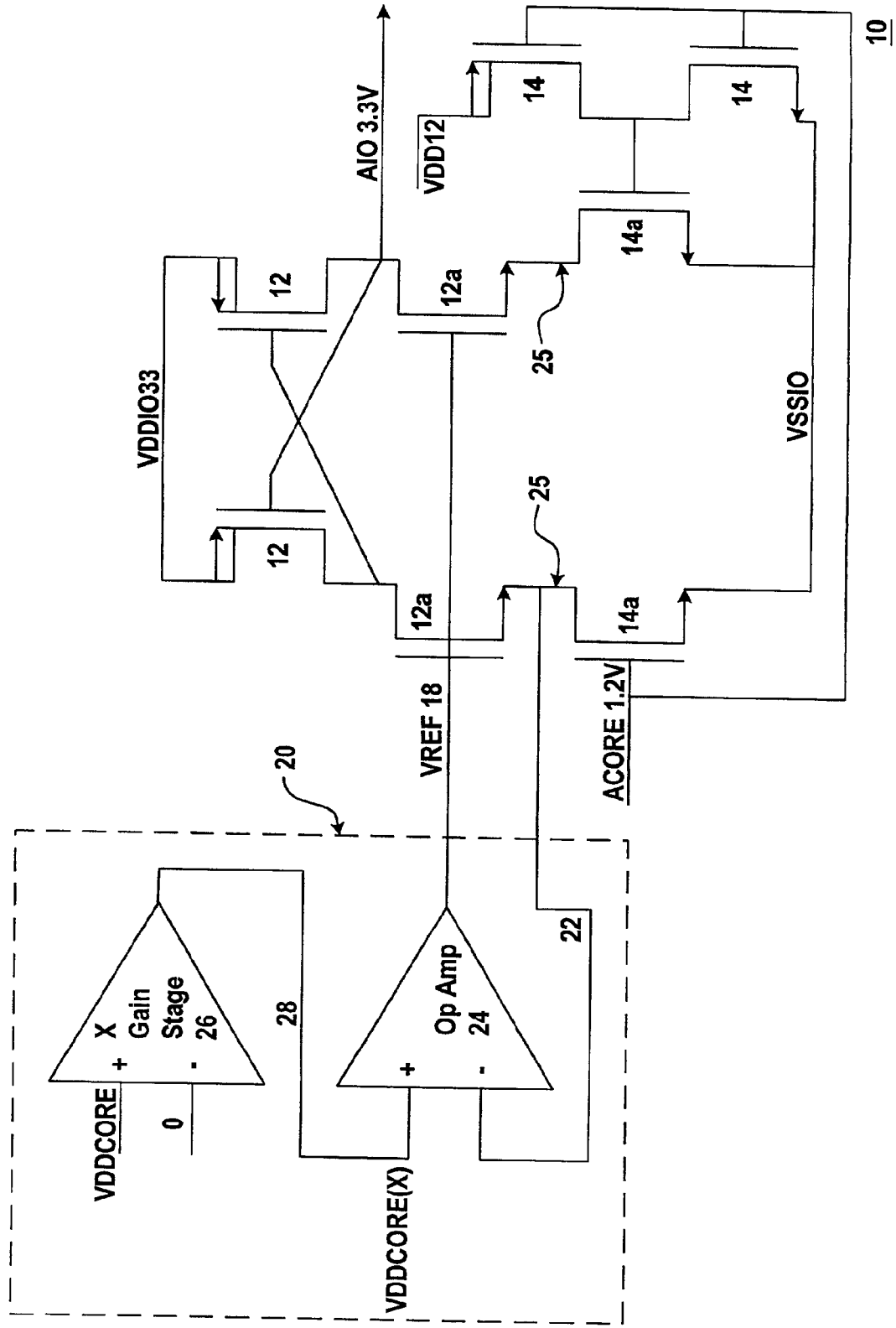
FIG. 7 is a circuit diagram of a level shifter replica bias circuit for generating a reliable level shifter cascade reference voltage, using a multiple of the VDDcore supply voltage.
Figure 8:
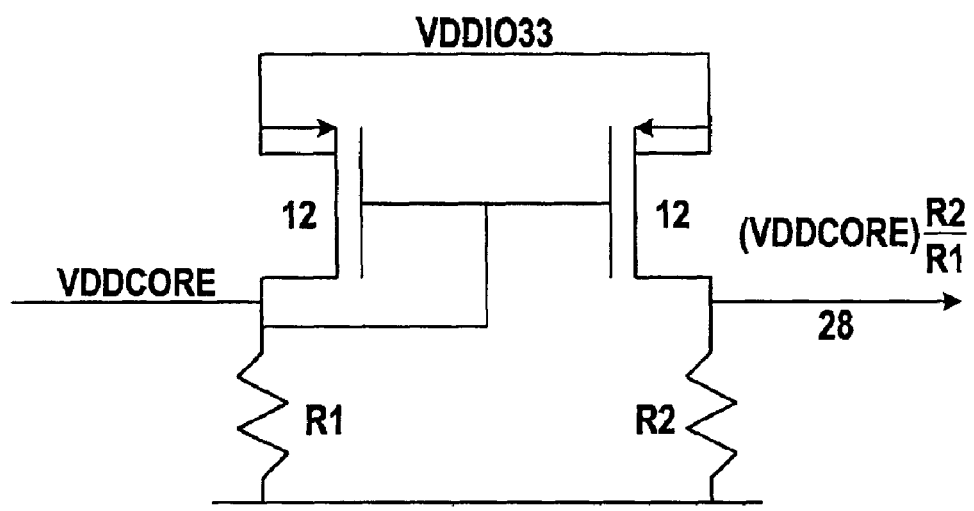
FIG. 8 is a circuit diagram of an adjustable source.

Therefore, if it is known that the voltage sensitive switching devices 14a have different drain voltage tolerances, such as X(VDDcore), where X is preferably a number between about 0.8 and 1.2, then the reference voltage source 20 is preferably fabricated as depicted in FIG. 7. The embodiment of the voltage shifter 10 as depicted in FIG. 7 places an X gain stage 26 on the input of the op amp 24, and then puts VDDcore as an input to the X gain stage 26. FIG. 8 depicts a preferred embodiment of the X gain Stage 26, where the output 28 of the X gain stage 26 is substantially equal to the input, which in this case is VDDcore, multiplied by the ratio of the value of two passive elements, which in the embodiment of FIG. 8 are resistors R1 and R2. Thus, the output 28 of the X gain stage 26 can be either greater than or less than the input of the X gain stage 26.

Figure 9:
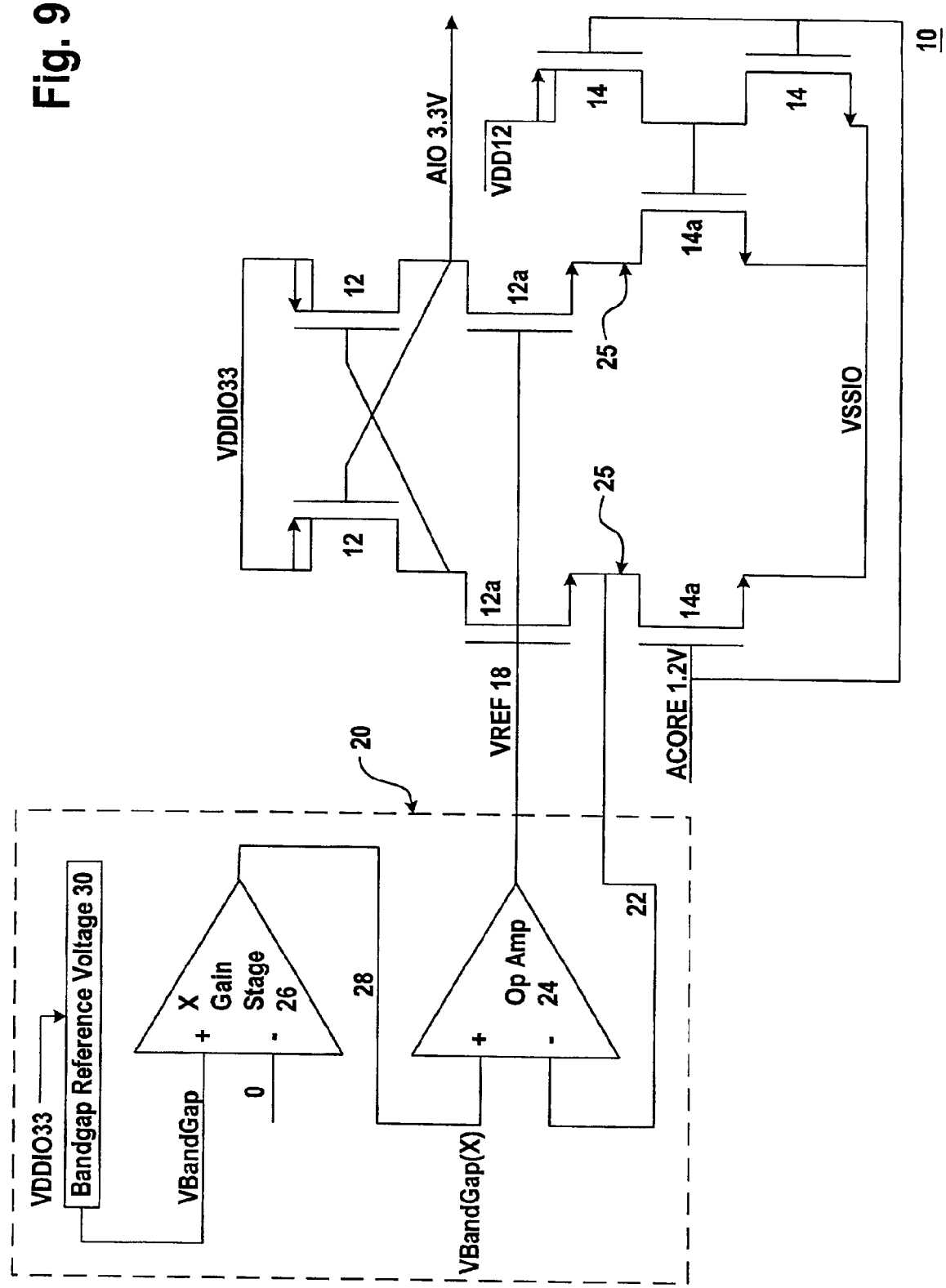
FIG. 9 is a circuit diagram of a level shifter with a feed back reference voltage from a band gap reference voltage.

In some embodiments it may be desirable to use a band gap reference voltage rather than VDDcore as the input to the X gain stage 26. The band gap reference voltage tends to be more stable over process and temperature than VDDcore, has less noise than VDDcore, and can be generated off of VDDio. Thus, the reference voltage source 20 can produce the reference voltage on line 18 before VDDcore comes up. This embodiment is depicted in FIG. 9, Where the reference voltage source 20 includes a band gap reference voltage 30 that is tied to one of the inputs of the X gain stage 26.

Thus, in the most preferred embodiment as described herein, the reference voltage source 20 is a low impedance node rather than a high impedance node, which tends to be more stable when the level shifter 10 operates at higher frequencies. Further, the preferred designs tend to be less sensitive to models and model predictability, temperature, and VDDio drift. Further, the preferred designs generate a stable protection voltage on the voltage sensitive nodes 25, rather than just a specific reference voltage potential on the reference voltage line 18. These designs are also very tolerant of temperature, process, and voltage variations on the regulating devices 12a.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a core voltage to input output voltage level shifter of the type that uses a reference voltage source to generate a reference voltage to limit a drain voltage on at least one voltage sensitive node connected to a voltage sensitive switching device residing on a high voltage domain, the improvement comprising:
    a feed back line running from the voltage sensitive node to the reference voltage source, and
    a feed back structure for varying the reference voltage in response to the drain voltage on the at least one voltage sensitive node, and thereby maintaining the drain voltage at a substantially constant desired value.

2. The level shifter of claim 1, wherein the feed back structure comprises an op amp with a first input tied to the feed back line and a second input tied to a low voltage domain.

3. The level shifter of claim 1, wherein the feed back structure comprises an op amp with a first input tied to the feed back line and a second input tied to an output of an X gain stage, with a first input tied to a low voltage domain.

4. The level shifter of claim 3, wherein the X gain stage comprises a circuit that produces an output that is a multiple of the low voltage domain and a ratio of two passive elements.

5. The level shifter of claim 3, wherein the X gain stage comprises a circuit that produces an output that is a multiple of the low voltage domain and a ratio of two resistors.

6. The level shifter of claim 3, wherein the X gain stage produces an output that is a multiple of between about 0.8 and about 1.2 of the low voltage domain.

7. The level shifter of claim 1, wherein the feed back structure comprises an op amp with a first input tied to the feed back line and a second input tied to an output of an X gain stage, with a first input tied to a band gap reference voltage with an input on the high voltage domain.

8. The level shifter of claim 7, wherein the X gain stage comprises a circuit that produces an output that is a multiple of the band gap reference voltage and a ratio of two passive elements.

9. The level shifter of claim 7, wherein the X gain stage comprises a circuit that produces an output that is a multiple of the band gap reference voltage and a ratio of two resistors.

10. The level shifter of claim 7, wherein the X gain stage produces an output that is a multiple of between about 0.8 and about 1.2 of the band gap reference voltage.

11. In an integrated circuit, the improvement comprising the level shifter of claim 1.

12. An integrated circuit, the improvement comprising:
    a core voltage to input output voltage level shifter that uses a reference voltage source to generate a reference voltage to limit a drain voltage on at least one voltage sensitive node connected to a voltage sensitive switching device residing on a high voltage domain,
    a feed back line running from the voltage sensitive node to the reference voltage source, and
    a feed back structure for varying the reference voltage in response to the drain voltage on the at least one voltage sensitive node, and thereby maintaining the drain voltage at a substantially constant desired value.

13. A method for limiting a drain voltage on at least one voltage sensitive node connected to a voltage sensitive switching device residing on a high voltage domain in a core voltage to input output voltage level shifter of the type that uses a reference voltage source to generate a reference voltage, the method comprising the steps of:
    sensing the drain voltage on the at least one voltage sensitive node with a feed back line running from the voltage sensitive node to the reference voltage source, and
    varying the reference voltage in response to the drain voltage on the at least one voltage sensitive node with a feed back structure, and thereby maintaining the drain voltage at a substantially constant desired value.

14. The method of claim 13, wherein the step of varying the reference voltage with the feed back structure comprises varying the reference voltage at the output of an op amp with a first input tied to the feed back line and a second input tied to a low voltage domain.

15. The method of claim 13, wherein the step of varying the reference voltage with the feed back structure comprises varying the reference voltage at the output of an op amp with a first input tied to the feed back line and a second input tied to an output of an X gain stage, with a first input tied to a low voltage domain.

16. The method of claim 15, wherein the X gain stage comprises a circuit that produces an output that is a multiple of the low voltage domain and a ratio of two passive elements.

17. The method of claim 15, wherein the X gain stage comprises a circuit that produces an output that is a multiple of the low voltage domain and a ratio of two resistors.

18. The method of claim 15, wherein the X gain stage produces an output that is a multiple of between about 0.8 and about 1.2 of the low voltage domain.

19. The method of claim 13, wherein the step of varying the reference voltage with the feed back structure comprises varying the reference voltage at the output of an op amp with a first input tied to the feed back line and a second input tied to an output of an X gain stage, with a first input tied to a band gap reference voltage with an input on the high voltage domain.

20. The method of claim 19, wherein the X gain stage comprises a circuit that produces an output that is a multiple of the band gap reference voltage and a ratio of two resistors.

* * * * *